US006368753B1

(12) United States Patent
Harriott et al.

(10) Patent No.: US 6,368,753 B1
(45) Date of Patent: Apr. 9, 2002

(54) MASK REPAIR

(75) Inventors: Lloyd Richard Harriott, Gillette; Anthony Edward Novembre, Martinsville, both of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/384,395

(22) Filed: Aug. 27, 1999

(51) Int. Cl.⁷ .................................................. G03F 9/00
(52) U.S. Cl. .......................................................... 430/5
(58) Field of Search ................................ 430/5; 378/34, 378/55

(56) References Cited

U.S. PATENT DOCUMENTS

| | | | | |
|---|---|---|---|---|
| 5,443,931 A | * | 8/1995 | Watanabe | 430/5 |
| 5,482,802 A | * | 1/1996 | Celler et al. | 430/5 |
| 5,935,739 A |   | 8/1999 | Bayer et al. | 430/5 |
| 6,030,731 A | * | 2/2000 | Yang | 430/5 |
| 6,140,020 A | * | 10/2000 | Cummings | 430/296 |

FOREIGN PATENT DOCUMENTS

| | | | |
|---|---|---|---|
| DE | 19710798 C | 7/1998 | G03F/1/14 |
| EP | 0153854 | 9/1985 | G03F/1/00 |
| EP | 0316111 | 5/1989 | G03F/1/00 |
| JP | 7005677 A | * 1/1995 | |
| JP | 62079465 A | * 4/1997 | |
| JP | 10254125 A | * 9/1998 | |

OTHER PUBLICATIONS

D.K. Stewart et al., "State of the art in focused ion beam mask repair systems," *Proceedings of the SPIE*, vol. 2512, pp. 398–411 (Apr. 1995).

* cited by examiner

Primary Examiner—Mark F. Huff
Assistant Examiner—Saleha R. Mohamedulla
(74) Attorney, Agent, or Firm—Bruce S. Schneider; Richard J. Botos

(57) ABSTRACT

A method for repairing scalpel masks is described. In particular, opaque defects are repaired by milling with a gallium beam at a sufficient energy to ensure appropriate implantation of gallium into the membrane underlying the blocking material. Transparent defects are repaired using a gallium beam that impacts styrene gas in the vicinity of the defect to be repaired.

9 Claims, 2 Drawing Sheets

PINHOLE (CLEAR) DEFECT    GAP (CLEAR) DEFECT    BRIDGE (OPAQUE) DEFECT

MASK REPAIR

BACKGROUND OF THE INVENTION

1. Technical Field

This invention relates to the fabrication of lithographic masks and, in particular, the fabrication of scattering lithographic masks utilized in device fabrication.

2. Art Background

In the fabrication of devices, e.g., semiconductor devices or optical devices, it is generally necessary to configure on a substrate a region (e.g., a metal, semiconductor or dielectric region) in a specific spatial pattern and location. (A substrate is a mechanically stable body including, e.g., semiconductor regions and/or metal regions and/or dielectric regions formed on a supporting body such as a glass plate or on a membrane deposed across a supporting structure.) The positioning and/or patterning of these regions is generally accomplished by a lithographic process. In this process a mask is utilized to image energy in the desired pattern onto a substrate surface that has been coated with a material sensitive to the incident energy. The mask in this exposure step is, in one procedure, placed in contact with or in close spatial relation to the substrate. Alternatively, the mask pattern is projected onto the substrate.

After exposure, development of the energy sensitive material is performed to selectively remove either the exposed, or unexposed regions, of the resist material. (For a negative resist the unexposed region is removed while for a positive resist the exposed region is removed.) Generally, a solvent or energetic entities from a plasma are employed to effect this removal. The resulting, patterned energy sensitive material, i.e., resist, is employable as a processing mask for accomplishing the processing, e.g., selective doping, etching, oxidizing of or deposition onto the underlying substrate regions.

A mask designed to be used in photolithography, i.e., lithography using light in the spectral range 150 nm to 450 nm, generally includes a patterned metal or metal oxide film. Materials such as chromium, chromium oxide, tungsten, molybdenum disilicide, magnesium fluoride or nickel are typically used for photomasks. These materials are commonly formed in a layer thickness of approximately 500 Angstroms to 1000 Angstroms for photomasks on a transparent substrate such as a quartz glass substrate that is generally 0.250 inches thick. (In the context of this disclosure, the terms transparent and blocking refer to the energy that is used in inducing reaction in the resist material to be exposed. For a material region of the mask to be considered blocking, it should, in the lithographic tool, lead to an attenuation of energy reaching the substrate that is at least tenfold less than energy impacting the substrate in an equal area of the nearest region where exposure of the resist is desired. If a region is not blocking, it is considered transparent.) The metal or metal oxide film of a photomask is typically patterned by depositing a resist material sensitive to electrons or photons onto its surface, exposing this resist material with a directed electron beam or laser, developing the exposed resist to form the desired pattern and transferring the pattern using, for example, etching to the underlying metal or metal oxide layer (see, D. J. Elliott, *Integrated Circuit Fabrication Technology*, McGraw-Hill, N.Y., 1982, for a description of the fabrication of photomasks).

In recent years, a new form of projection electron lithography denominated SCALPEL (Scattering Angular Limited Projection Electron Lithography) has been developed. In this form of lithography, the mask has blocking and transparent regions. However, the blocking regions are built to allow a substantial level of incident electrons to traverse and emerge from the mask through scattering. (For a description of SCALPEL lithography, see L. R. Harriott, "Scattering with Angular Limitation Projection Electron Beam Lithography for Suboptical Lithography", *Journal of Vacuum Science and Technology*, B15(6), 2130 (1997) which is hereby incorporated by reference.) The transparent regions also allow electrons to traverse the mask and emerge but induce scattering to a lesser extent. Generally a thin membrane such as a silicon nitride membrane is supported at its periphery and functions as transparent regions, while patterned metal regions such as tungsten supported on, or deposed under, the membrane (with reference to the electron source) acts as blocking regions. A filter placed at the back focal plane (or conjugate plane) of the projection lens differentiates the electrons passing through blocking regions from those passing through transparent regions of the mask. Through this differentiation, electrons either passing through the blocking regions or electrons passing through the transparent regions are allowed to reach the resist.

In the manufacture of masks, transparent defects such as pin holes or entire missing portions in blocking regions often occur. These defects, in turn, cause defects in the integrated circuit or other device produced when using the mask. Alternatively, opaque defects, i.e., unwanted blocking regions that are unintended parts of the blocking pattern, also result in defects in the final device. Additionally, for a SCALPEL mask, a pinhole in the membrane (transparent region) produces a defect that is manifested as a bright spot in the exposure image. This bright spot, depending on its location, can result in irradiation in directly adjoining regions where the image is potentially distorted.

Since the manufacture of masks is generally a time consuming and relatively expensive operation especially for scattering masks, it is often desirable to repair a defective mask by selectively forming blocking material on the unwanted transparent region or removing an unwanted blocking region. The repair procedure is, however, not acceptable unless it is less costly than merely producing another mask. The repair should also produce a blocking deposit that is sufficiently adherent to the mask substrate that subsequent processing and cleaning during mask fabrication or during subsequent use of the mask does not induce loss of the repaired material. Additionally, the resolution of the repair procedure should be at least as good as the desired resolution of the mask itself to avoid mask and, in turn, device degradation.

A variety of processes have been disclosed for effecting repair of defects. In one procedure developed for optical masks and for stencil masks employed with electron beams, repair of transparent defects is effectuated by ion beam induced reaction. In particular, a beam of gallium ions is directed at a transparent defect. An unsaturated gas such as styrene is introduced into the path of the gallium ions at the defect. The ion beam induces a reaction in the styrene that causes a carbonaceous deposit at the defect. This carbonaceous deposit has been found to be an absorber of light or electron beams and thus functions to repair transparent type defects in masks intended to prevent incident energy from traversing blocking regions. (See U.S. Pat. No. 5,273,849 which is hereby incorporated by reference.)

Repair methods for SCALPEL masks have not been reported. However, opaque defects in photolithographic masks have typically been repaired by employing ion milling. In this process, an ion beam e.g. a gallium beam, is directed at the opaque defect. Impact of the beam on the defect causes removal of the unwanted material through momentum transfer and subsequent scattering. The beam is traversed over the defect until the unwanted blocking material is removed.

SCALPEL masks, because they constitute blocking regions formed on a relatively thin transparent membrane are significantly more difficult to repair than typical photolithographic masks. The membrane is susceptible to damage that could cause mechanical failure of the membrane or a change in its thickness that leads to an unacceptable lithographic change. Thus, procedures such as ion milling present a problem associated with such damage. Additionally, use of gallium ions to mill opaque defects in photolithographic masks have resulted in the production of opaque regions in the portion of the quartz substrate bombarded by the beam after the opaque defect is removed. This undesired opacity in the quartz is removed by subsequent etching of the surface quartz to remove the substantial thickness of quartz damaged by the ion milling. Although the resulting photomask is quite acceptable, a similar remediation process for a SCALPEL mask is not acceptable because the thickness of the membrane, e.g. typically 70 to 150 nm, does not permit the required subsequent etching.

Similarly, any repair of a transparent defect including a membrane pinhole in a SCALPEL mask must have suitable density thickness and atomic number of its constituent atoms so that the mask is not lithographically compromised. Thus, any material used to repair a transparent defect must scatter to the same extent as the surrounding mask material (e.g. membrane or blocking region) rather than block the incident electrons. Thus, substantial problems are presented by the repair of SCALPEL masks relative to photolithographic masks.

SUMMARY OF THE INVENTION

It has been found that a SCALPEL mask is repairable (both transparent—including membrane pinholes—and opaque defects) by using procedures involving gallium entity beams. (A gallium entity is one that contains a gallium atom irrespective of its charge state and irrespective of how, if at all, it is bound.) Surprisingly, opaque defects are removable using a gallium entity beam without unacceptable damage to the underlying membrane and without inducing unacceptable increase in the degree of scattering induced by the repaired region. Although the beam does remove a portion of the membrane, by employing an appropriate acceleration voltage for the gallium, implantation of the gallium in the membrane occurs. It is contemplated that this implantation lithographically corrects at least in substantial part for the portion of the membrane removed during the milling process.

Equally surprisingly, the interaction of a gallium beam with styrene result in deposits that with appropriate adjustment of thickness have equivalent scattering properties to both the membrane and the blocking regions, so that effective repair is achieved without unacceptable degradation of lithographic properties. For example, a 1000 Å thick deposit formed by the interaction of a gallium beam with styrene has essentially equivalent scattering properties to a 275Å thickness of tungsten blocking region and an 80 nm thick deposit has equivalent properties to a 100 nm thick silicon nitride membrane. As a result, the repair of SCALPEL masks is possible both for transparent and opaque defects using a gallium beam either in the presence of styrene to repair transparent defects or in the absence of styrene to repair opaque defects. Thus, both opaque and transparent type defects are repairable in the same chamber without a break in vacuum. Accordingly, SCALPEL masks are efficiently repaired without unacceptable degradation of lithographic properties.

DETAILED DESCRIPTION

Figure 1:
FIG. 1 illustrates three types of mask pattern defects.

As discussed, the use of a beam formed from gallium entities is employable for repairing both opaque, and transparent defects in a SCALPEL mask. For pedagogic purposes, repair of transparent defects will be discussed first. (Such repair includes procedures relating to both pinholes in the membrane and defects in the blocking regions.) Subsequently, the repair of opaque defects will be discussed.

Defects in the context of a transparent error in the mask should be carefully defined. Defect is an unintended artifact in the mask that leads during lithography to an undesired feature in the resist layer that is ultimately transferred into the underlying material layer through, for example, ion implantation or etching. Thus, any mask artifact that produces a feature that unacceptably degrades the performance of the device ultimately to be manufactured, is considered a defect. Typically, pinholes in the membrane regions not overlain by blocking material are defects, i.e., result in unacceptable device performance if they have an effective diameter larger than the minimum feature size on the mask. (Effective diameter is the diameter of a circle having the same area as the pinhole. Additionally, overlying in the context of this application is a material that is closer to the source of electrons than the material overlain when the mask is inserted in the lithographic tool.) Defects in the blocking regions that lead to unacceptable device degradation depend upon the design rule of the device. (Design rule in this context is the minimum feature size—typically the length of the gate.) Generally, for design rules in the range 30 to 200 nm, an opaque defect is a region of blocking material that is 1) of adequate thickness to scatter electrons sufficiently so that a contrast greater than 50% is produced relative to non-blocking regions and that 2) covers an area of the membrane greater than the minimum feature size resulting in an undesired portion in the final pattern.

As previously discussed, SCALPEL masks include a membrane typically overlain (or possibly underlain) by blocking regions. To repair a transparent defect, such as a spatial area of the blocking region, deposition of a carbonaceous material containing gallium is induced. This process involves impacting styrene with a gallium entity beam. (Gallium entities include both ions of gallium, and neutral gallium atoms, as well as clusters of gallium atoms.) The thickness of the ultimate deposit should be sufficient to produce scattering of incident electrons that is equivalent to the scattering of electrons of essentially the same energy induced by respectively the membrane or the blocking region depending on the type of transparent defect to be repaired. (Equivalent scattering in this context means the contrast at the area of the substrate corresponding to the mask repair region has a contrast relative to a proximate region of the substrate corresponding to a transparent region of the mask that is at least 80% of that contrast measured for a mask of the same pattern that does not require a repair in the subject region.) It is possible to determine the degree of scattering (degree of scattering being defined as percentage contrast relative to an equivalent feature requiring no repair) for a specific thickness of the deposited gallium containing material deposited under specific conditions through use of a controlled sample. In particular, samples of various thicknesses are deposited employing the parameters such as current, spot size, dwell time and gas pressure to be employed in the ultimate repair. The contrast induced by such samples are then determined by calculations as described in M. M. Mhrtchyan et al., "Electron Scattering and Transmission through SCALPEL Masks", *Journal of Vacuum Science and Technology*, B16(6), 3385 (1998) or by measurement in a transmission electron microscope using the same electron energy as that contemplated for the ultimate SCALPEL lithography to be employed. A plot of contrast versus thickness allows choice of a thickness to produce equivalent scattering of a region repaired. Typically, membranes formed from materials such as silicon nitride having thicknesses in the range of 50 to 200 nm require deposited thickness in the range 30 to 175 nm for the typical deposition parameters employed. Similarly, blocking regions formed for example of tungsten having thicknesses in the range 20 to 50 nm require deposited thicknesses in the range 50 to 200 nm to produce a region of equivalent scattering. Significantly, the deposition thicknesses generally required for the repair of both membrane and blocking region transparent defects is within a practical range.

In one embodiment, the specific process for forming the desired deposits is described in U.S. Pat. No. 5,273,849 dated Dec. 28, 1993, which is hereby incorporated by reference. Typically, styrene gas is introduced at a distance of 100 $\mu$m to 1 mm from a defect with the delivery tube having an opening typical 100 $\mu$m to 1 mm in diameter. Generally, it is desirable to maintain gas flux by employing a distance approximately equal to the tube bore diameter. Distances greater than a few millimeters are typically unacceptable because the gas flux at the defect is generally unacceptably low while distances closer than 100 $\mu$m are generally not practical to maintain. Styrene is introduced typically at a pressure measured at the input to the delivery tube in the range of 1 to 10 Torr. Pressures less than 1 Torr generally yield excessively slow depositions and indeed even sputter removal while pressures greater than 10 Torr lead to undesirable deposition on the deposition chamber walls. Typically the molecular flux of the gas at the defect is desirably maintained to be approximately equal to the ion flux from the gallium beam.

Generally, the gallium entities employed to form the beam are accelerated through a potential difference in the range 10 to 50 kV. Differences less than 10 kV usually lead to unacceptable spatial resolution while voltages greater than 50 kV are typically unacceptable because implantation of gallium becomes a competing process. It is possible once the gallium entities are accelerated to neutralize the charge by expedients such as flood low energy electron beams introduced at the defect being repaired. Typical gallium beam currents in the range 10 pA to 10 nA are employed to achieve an acceptable deposition rate using a beam spot size in the range 10 nm to 200 nm. To produce appropriate thicknesses to repair defects in the membrane or blocking region generally doses in the range 0.1 to 1.0 nC/$\mu$m$^2$ are employed. Generally, for the suggested beam current and spot size dwell times in the range 1 to 100 $\mu$sec are employed to yield suitable doses. It is possible to raster scan (or otherwise scan) a defect with the gallium beam. In such repair, the time between impact of the beam in a given region and the next incidence of such impact inducing deposition should be between 10 $\mu$sec and 10 msec.

As discussed, the specific dose and other parameters are chosen to yield a deposit having equivalent scattering properties to the area repaired.

Opaque defects are repaired by milling using gallium entities. The gallium entities are produced as described with relation to repair of transparent defects. Advantageously, the same acceleration voltages are employable as are used for transparent defect repair. In this manner, a switch between repairing transparent to opaque defects merely requires terminating the deposition gas flow. Generally, no gas is introduced during the repair of opaque defects. Nevertheless, it is possible to have a background pressure less than 10$^{-6}$ Torr with this pressure being due to gases such as nitrogen and other components of air. Impact of the gallium entities for removal of an opaque defect is continued until the repair is effected. Generally, a dose sufficient to remove the defect thickness is employed. Most significantly, an inordinate impact after the defect removal is avoided, so that the scattering properties of the membrane exposed during unwanted blocking region removal is not unacceptably affected. Electrons accelerated through a potential greater than 5 kV, and advantageously in the range 10 to 50 kV are generally employed. Typically spot sizes in the range 10 to 200 nm are employed together with beam currents in the range 1 pA to 10 nA to yield acceptable removal rates. Generally for these parameters, defects with materials such as tungsten are removed in a time in the range of 1 sec to 1 minute.

The following examples are illustrative of the conditions employed in the practice of the subject invention.

A SCALPEL mask was fabricated to have a series of defects representative of those frequently encountered in the preparation of such masks. These defects included areas where the scattering layer of the mask was not present, areas having a scattering layer where none would be desired in normal fabrication processes, and pinhole areas missing scattering material where in normal fabrication such material would be desired. Each one of such defects was present in a variety of sizes ranging approximately from 0.3 $\mu$m to 1 $\mu$m. The mask pattern for the three types of programmed defects is shown in FIG. 1. This mask had blocking regions of tungsten approximately 275 Å in thickness and a chromium layer approximately 60 Å in thickness underlying the tungsten. Additionally, the mask employed a silicon rich silicon nitride (approximately 60 atom % silicon) membrane. The thickness of this membrane was approximately 1500 Å and the membrane had a tensile stress of approximately 150 MPa. The mask was formed by the process described in Novembre, A. E., Peabody, M. L., Blakey, M. I., Farrow, R. C., Kasica, R. J., Liddle, J. A., Saunders, T., and Tennant, D. M., "Fabrication and Commercialization of SCALPEL Masks", *Proc. SPIE*, vol. 3412, p. 350, (1998). As described in that publication, the mask had grillage with membrane regions of 1 mm wide ×12 mm long between the grills. The entire mask measured approximately 100 mm in diameter. The masks employed were not mounted on a silicon support ring.

The lithographic process used to make the mask blocking region pattern is described in Novembre, A. E., Blakey, M. I., Farrow, R. C., Kasica, R. J., Knurek, C. S., Liddle, J. A., Peabody, M. L., "Pattern processing results and characteristics for SCALPEL masks", *Microelectronic Engineering*, vol. 46(1–4), p. 271, (1999). The resist employed in this lithographic process was ZEP-520, which is a resist material sold by Nippon Zeon, and is basically a copolymer between a halogenated acrylate and α-methylstyrene. The resist was spun onto the silicon wafer used in mask formation prior to processing. The resist was subsequently exposed in the pattern described above using a JEOL Model 6000 electron beam exposure system. A dose of 75μC/cm$^2$ was employed at an acceleration voltage of 50 kV. The exposure was done with a spot size of approximately 80 nm. The resist was processed using a pre-exposure bake of 170° C. for 10 minutes in air, and a post develop bake of 145° C. for 30 minutes. The resist was developed using a STEAG Hamatech Resist Development System. The developer employed was xylene used in a spray spin mode and one rinse using 2-propanol. After the rinse, the mask was spun dry in air.

Once the resist had been processed, the resulting pattern was transferred into the underlying tungsten layer. This transfer was accomplished in a Plasma Therm 770 reactive ion etcher. The etching gas employed was an 85/15 mole percent sulfur hexafluoride to oxygen mixture. The flow rate (sccm) of the gas mixture was 45 $SF_6$; 5 $O_2$ resulting in a partial pressure of 10 mTorr and a power of approximately 60 Watts utilizing a 13.6 MHz rf source. The approximate etch time was 80 sec.

The chromium layer underlying the tungsten layer was then etched utilizing an immersion bath sold by Cyantek having the formulation ID CR7, which is basically a mixture of ceric ammonium nitrate in perchloric acid. The mask was immersed for approximately two minutes. The resist was then stripped by employing an oxygen plasma in the Plasma Therm 770 etcher at an oxygen partial pressure of 30 mTorr, a flow rate of 20 sccm and power of 40 Watts for a time period of 7–10 min.

A series of controlled experiments were performed to determine the deposition thickness resulting from specific conditions employed with styrene gas and a gallium beam. The deposition tool employed was a Micrion-8000 Focused Ion Beam Mask Repair Tool. Each of these controlled samples employed the following conditions:

|  | Value used |
| --- | --- |
| Ion Source | Ga$^+$ |
| Accelerating Voltage | 30 keV |
| Beam Current | 98 pA |
| Spot Size | 50 mn (FWHM) |
| Current Density | 5 A/cm$^2$ |
| Pixel Spacing | 75 nm |
| Dwell Time | 1.0 μsec |
| Refresh Time | 1000 μsec |
| Precursor Gas | styrene |
| Gas Pressure | 8 × 10$^{-6}$ Torr |
| Nozzle Position | 1 mm radial, 200 μm from mask |

Figure 2:
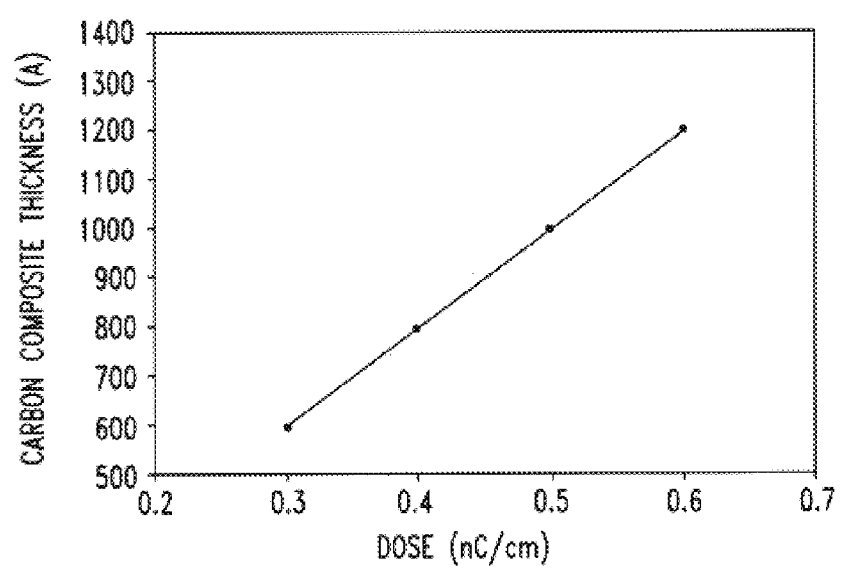
FIG. 2 illustrates the thickness of a mask repair deposit as a function of dose.

The time for each deposition was varied so that the doses employed ranged from 0.3 nC/cm$^2$ to approximately 0.6 nC/cm$^2$. FIG. 2 shows a graph of the resulting deposit thickness versus dose. Auger analysis of the composition showed an approximate stoichiometry of 30 at. % gallium, 65 at. % carbon and 5 at. % oxygen. (The carbon and oxygen percentages are approximate and together constitute approximately 70 at. % of the material.)

A similar series of controlled experiments were performed using the same conditions but without introduction of styrene to determine the rate of removal of the tungsten blocking material for varying doses of gallium.

Figure 3:
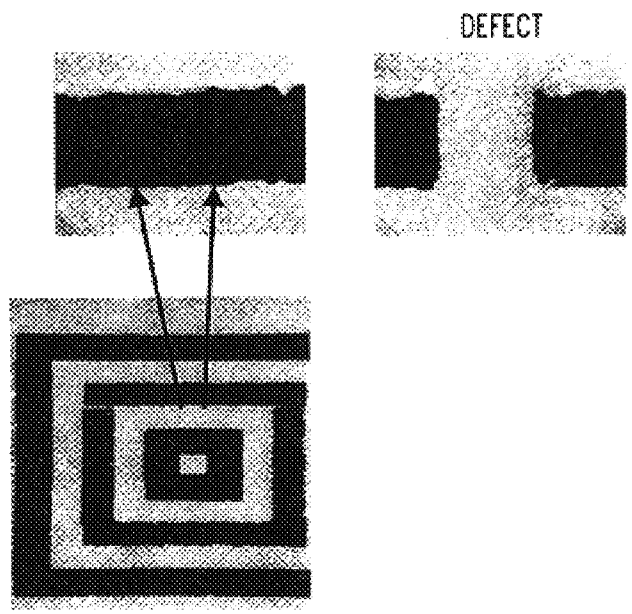
FIG. 3 illustrates the result for an opaque defect employing a gallium ion beam.

The gallium ion beam dose was varied from 0.03 nC/cm$^2$ to 1.5 nC/cm$^2$. The resulting plot of dose versus removal rate showed a slope of 30 Å/sec. The result for a 0.7 μm opaque defect employing a dose of 0.09 nC/cm$^2$ is shown in FIG. 3.

Figure 4:
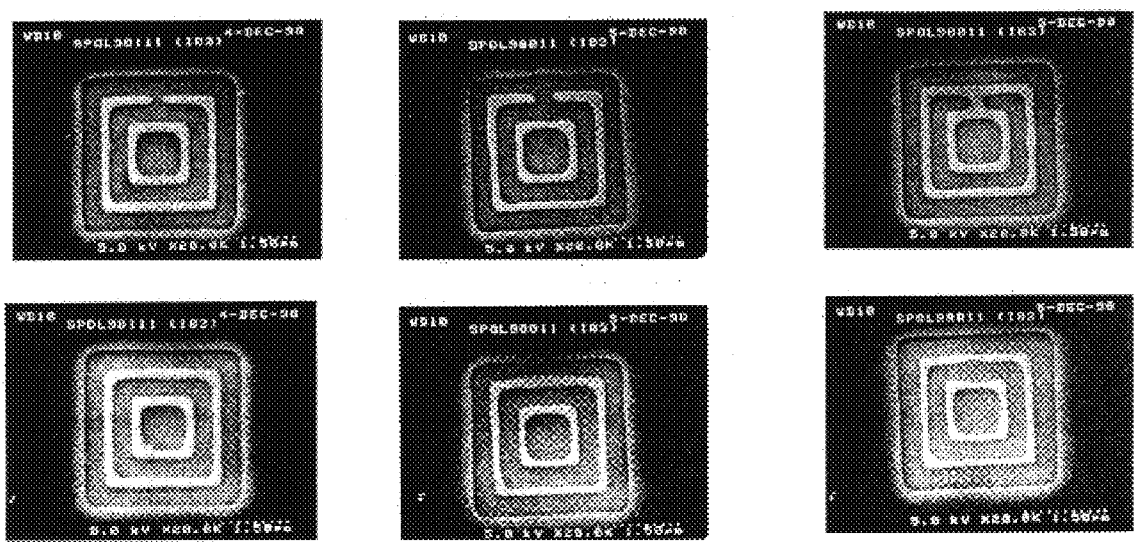
FIG. 4 illustrates developed patterns obtained from masks with unrepaired defects and with repaired defects.

Utilizing these controlled samples, it was determined that clear defects in the tungsten layer should be repaired employing a deposition thickness of 100 nm and removal of the opaque tungsten defects should employ a dose of 0.09 nC/cm$^2$, Employing these repair thicknesses and doses, respectively, the various defects in the sample mask (described above) were repaired. Some defects were left unrepaired for comparison purposes. The mask was then positioned in the SCALPEL exposure tool and was used to expose a resist coated wafer as described in Novembre, A. E., Ocola, L., Houlihan, F., Knurek, C., Blakey, M., "New Developments in Resist Materials for the SCALPEL Technology", *J. Photopolymer Science and Technology*, vol. II, No. 3, p. 541, (1998). The conditions employed were an acceleration voltage of 100kV, the dose was approximately 35 μC/cm$^2$ with a back plane filter aperture of 2mrad relative to the wafer. The resist employed on the wafer was purchased from Olin Microelectronic Materials and was a chemically amplified resist utilizing a resin formed from poly (hydroxy styrene), a dissolution inhibitor employing a t-butoxycarbonyloxymethyl protective group and a photoacid generator constituting triphenylsulfoniun triflate. The resist was spun to have a 0.2 μm thickness. The pre and post exposure bake of the resist was at 115° C. for one minute employing a vacuum hold down hot plate. The development was accomplished by immersion in 0.13N tetramethylammonium hydroxide for one minute, and rinsed in deionized water for one minute. The resulting pattern was inspected using a scanning electron microscope. The micrographs obtained are shown in FIG. 4. As can be seen from these micrographs, excellent repair both of opaque and transparent defects are effected. However, in the bottom micrograph on the right-most pair some intrusion occurred solely due to misplacement of the mask repair gallium ion beam and not due to any shortcoming of the process.

What is claimed is:

1. A process for fabricating a mask useful in lithography wherein said mask comprises two type regions that scatter electrons to a different extent wherein said regions are configured in spatial areas such that a pattern is projectable in a lithographic tool onto a substrate based on said extent of said scatter, said process comprising forming a deposit to modify said spatial area at least in one of said spatial areas, said deposit having a thickness such that said deposit scatters incident electrons in an equivalent manner to said spatial area that was modified, wherein said forming of said deposit comprises introducing styrene in proximity to said spatial area to be modified and impacting said styrene with gallium entities.

2. The process of claim 1 wherein one of said regions comprised tungsten.

3. The process of claim 2 wherein one of said regions comprises silicon nitride.

4. The process of claim 1 wherein one of said regions comprises silicon nitride.

5. The process of claim 4 wherein said deposit has a thickness in the range 30 to 175 nm.

6. The process of claim 1 wherein said deposit has a thickness in the range 30 to 175 nm.

7. The process of claim 1 wherein said styrene is introduced at a distance in the range from 100 μm to 1 mm from said spatial area.

8. A mask comprising a pattern comprising regions of two types wherein said regions scatter electrons to different extents such that electrons scattered by one of said regions are lithographically differentiable from electrons scattered from the other of said regions and wherein one of said regions include a material comprising a deposit formed by the impact of gallium entities on styrene.

9. A mask comprising a pattern comprising regions of two types wherein said regions scatter electrons to different extents such that electrons scattered by one of said regions are lithographically differentiable from electrons scattered from the other of said regions and wherein the region that scatters electrons less includes implanted gallium entities.

* * * * *